(12) United States Patent
Watanabe

(10) Patent No.: US 10,129,980 B2
(45) Date of Patent: Nov. 13, 2018

(54) CIRCUIT BOARD AND ELECTRONIC COMPONENT DEVICE

(71) Applicant: SHINKO ELECTRIC INDUSTRIES CO., LTD., Nagano-shi, Nagano (JP)

(72) Inventor: Shoji Watanabe, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/601,225

(22) Filed: May 22, 2017

(65) Prior Publication Data

US 2017/0347455 A1 Nov. 30, 2017

(30) Foreign Application Priority Data

May 24, 2016 (JP) ................. 2016-103017

(51) Int. Cl.
| | |
|---|---|
| H05K 1/18 | (2006.01) |
| H05K 1/11 | (2006.01) |
| H05K 3/10 | (2006.01) |
| H05K 3/28 | (2006.01) |
| H05K 3/32 | (2006.01) |
| H05K 3/40 | (2006.01) |
| H05K 3/34 | (2006.01) |
| H05K 3/46 | (2006.01) |

(52) U.S. Cl.
CPC ............ *H05K 1/18* (2013.01); *H05K 1/113* (2013.01); *H05K 3/103* (2013.01); *H05K 3/287* (2013.01); *H05K 3/32* (2013.01); *H05K 3/4007* (2013.01); *H05K 3/3436* (2013.01); *H05K 3/4644* (2013.01); *H05K 2201/10674* (2013.01); *H05K 2201/10977* (2013.01)

(58) Field of Classification Search
USPC .................................. 361/748, 737
See application file for complete search history.

(56) References Cited

U.S. PATENT DOCUMENTS

| | | | | |
|---|---|---|---|---|
| 2012/0222894 | A1* | 9/2012 | Kaneko ................. | H05K 3/244 174/257 |
| 2013/0140692 | A1 | 6/2013 | Kaneko et al. | |

FOREIGN PATENT DOCUMENTS

| | | |
|---|---|---|
| JP | 2007-103878 | 4/2007 |
| JP | 2013-118255 | 6/2013 |

* cited by examiner

*Primary Examiner* — Andargie M Aychillhum
(74) *Attorney, Agent, or Firm* — Rankin, Hill & Clark LLP

(57) ABSTRACT

A circuit board includes an insulating layer having a protrusion on a surface, and a connection pad formed on an upper surface of the protrusion. A peripheral portion of a lower surface of the connection pad is exposed from the protrusion.

9 Claims, 15 Drawing Sheets

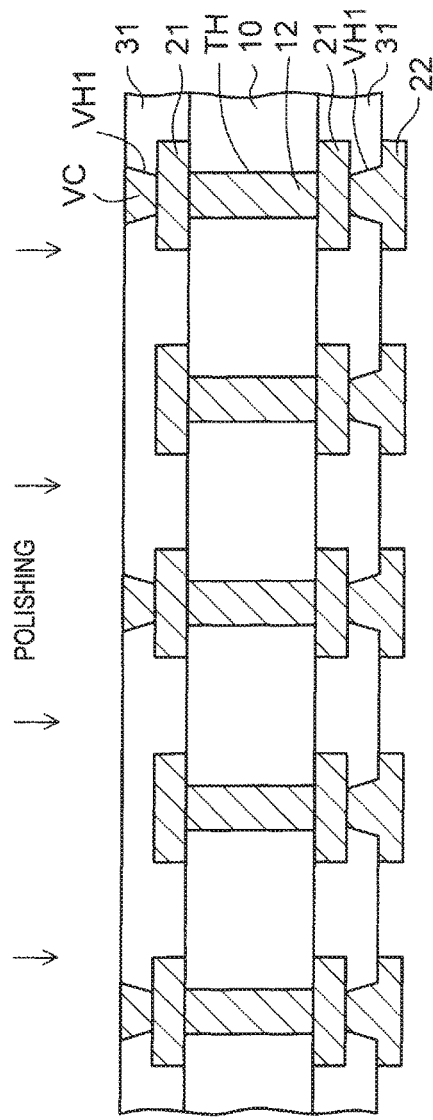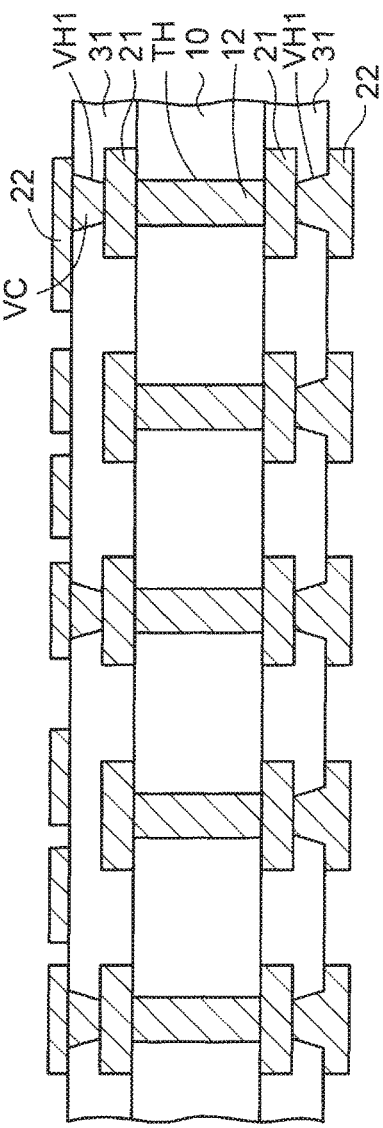

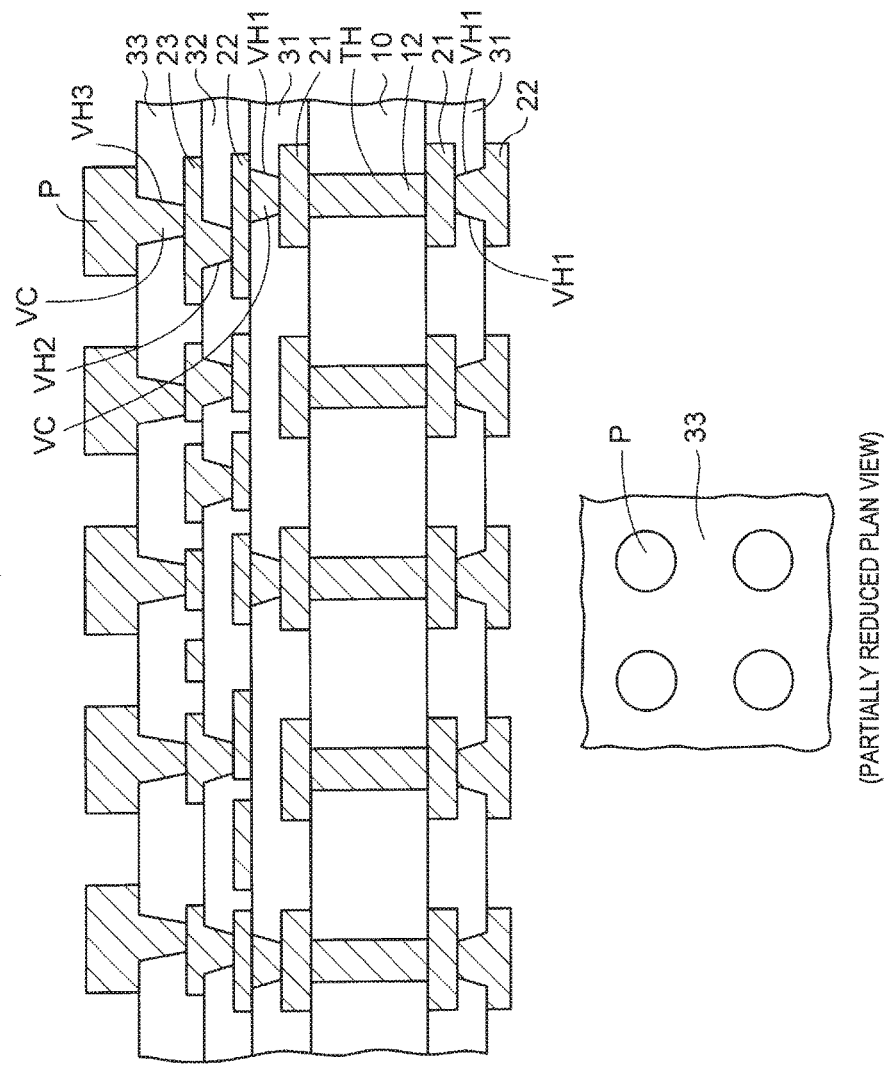

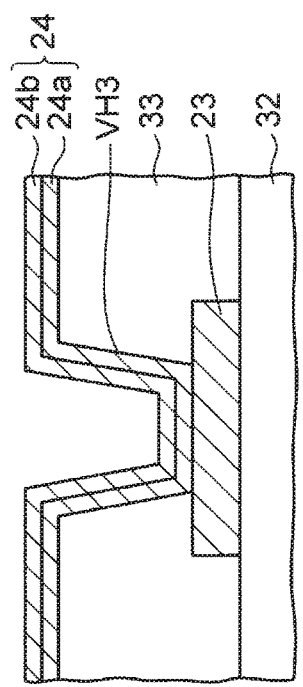
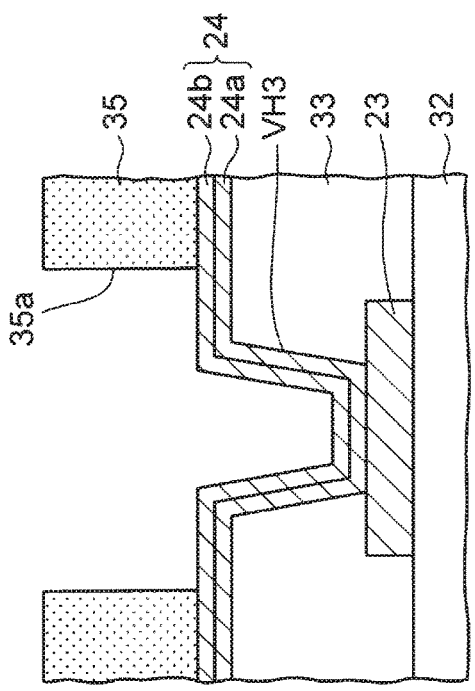

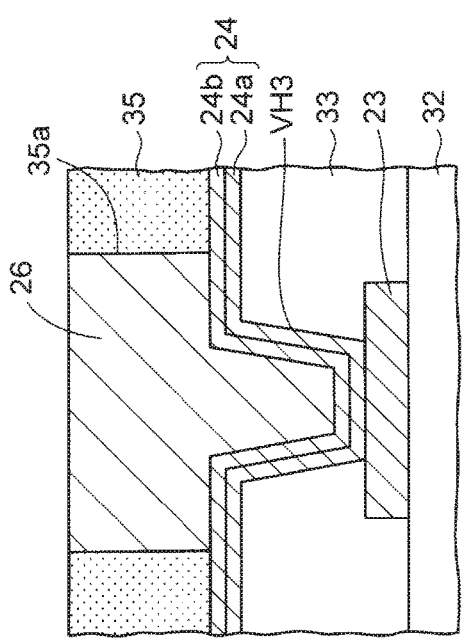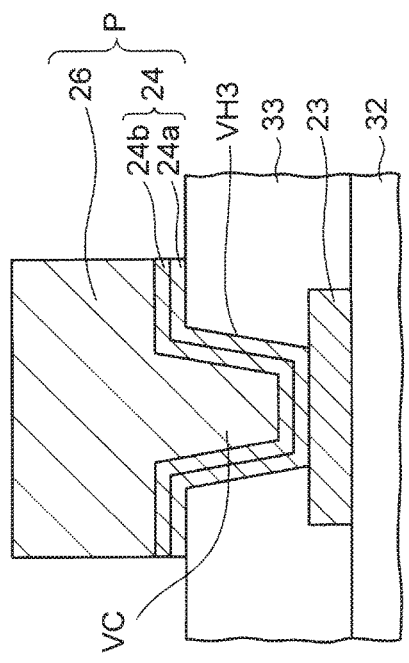

CIRCUIT BOARD AND ELECTRONIC COMPONENT DEVICE

CROSS-REFERENCE TO RELATED APPLICATION

The present application claims priority from Japanese Patent Application No. 2016-103017 filed on May 24, 2016, the entire content of which is incorporated herein by reference.

BACKGROUND

Technical Field

The present disclosure relates to a circuit board, and an electronic component device.

Related Art

In the related art, an electronic component device is configured by connecting an electronic component such as a semiconductor chip to a circuit board by flip-chip bonding. In such an electronic component device, bump electrodes of electronic component are connected to connection pads of a circuit board by solder, and the spaces between the circuit board and the electronic component are filled with an underfill resin.

[Patent Document 1] Japanese Patent Application Publication No. 2007-103878

[Patent Document 2] Japanese Patent Application Publication No. 2013-118255

As will be described with respect to preliminary technologies, if a temperature cycle test is performed on an electronic component device configured by connecting a semiconductor chip to a circuit board by flip-chip bonding, it is easy for thermal stress to be concentrated on the lower corner portions of connection pads of the circuit board.

For this reason, cracks are generated from the portions of a resin layer contacting the lower corner portions of the connection pads into the connection pads.

SUMMARY

Exemplary embodiments of the invention provide a circuit board, and an electronic component device capable of preventing portions an insulating layer around connection pads from being cracked.

A circuit board according to an exemplary embodiment, comprises:
an insulating layer having a protrusion on a surface; and
a connection pad formed on an upper surface of the protrusion,
wherein a peripheral portion of a lower surface of the connection pad is exposed from the protrusion.

A method of manufacturing a circuit board according to an exemplary embodiment, comprises:
forming a connection pad on an insulating layer; and
etching the insulating layer to a depth of half of the thickness, using the connection pad as a mask, such that a protrusion of the insulating layer is formed below a lower surface of the connection pad and a peripheral portion of the lower surface of the connection pad is exposed from the protrusion protrusion on the surface, and the connection pad is formed on the upper surface of the protrusion of the insulating layer. Further, the peripheral portion of the lower surface of the connection pad is exposed from the protrusion.

If this structure is used, the insulating layer does not exist at the lower corner portion of the connection pad on which thermal stress may be concentrated and thus, the insulating layer does not have any portion to be the origin of a crack. Therefore, it is possible to prevent cracking and peeling from occurring in the insulating layer disposed below the connection pad.

Also, since the upper surface of the protrusion of the insulating layer is disposed below the lower surface of the connection pad, the protrusion of the insulating layer functions as a base supporting the connection pad. Therefore, in a case of connecting an electronic component to the connection pad of the circuit board by flip-chip bonding, it is possible to secure sufficient strength.

BRIEF DESCRIPTION OF THE DRAWINGS

FIGS. 5A and 5B are cross-sectional views illustrating a third part of the method of manufacturing the circuit board of the embodiment.

FIG. 9 is a cross-sectional view and a plan view illustrating a seventh part of the method of manufacturing the circuit board of the embodiment.

FIGS. 10A and 10B are partially enlarged cross-sectional views illustrating a first part of a method of forming connection pads of FIG. 9.

FIGS. 11A and 11B are partially enlarged cross-sectional views illustrating a second part of the method of forming the connection pads of FIG. 9.

DETAILED DESCRIPTION

Hereinafter, embodiments will be described with reference to he accompanying drawings.

Prior to a description of embodiments, preliminary technologies underlying them will be described. A description of the preliminary technologies includes the contents of unknown novel technologies as the contents of personal examination of the inventor.

Figure 1:
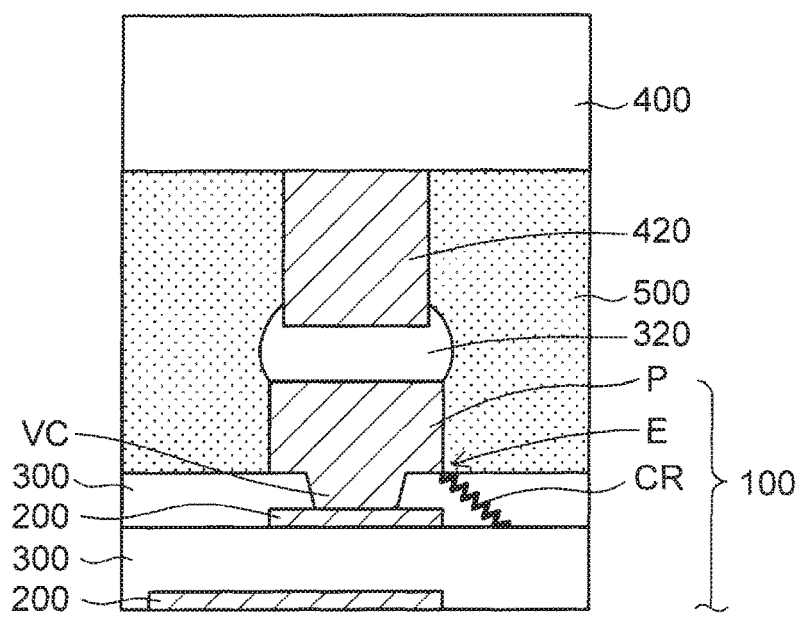
FIG. 1 is a cross-sectional view illustrating the state of a connection portion of a circuit board and a semiconductor chip in an electronic component device according to a preliminary technology.
Figure 2:
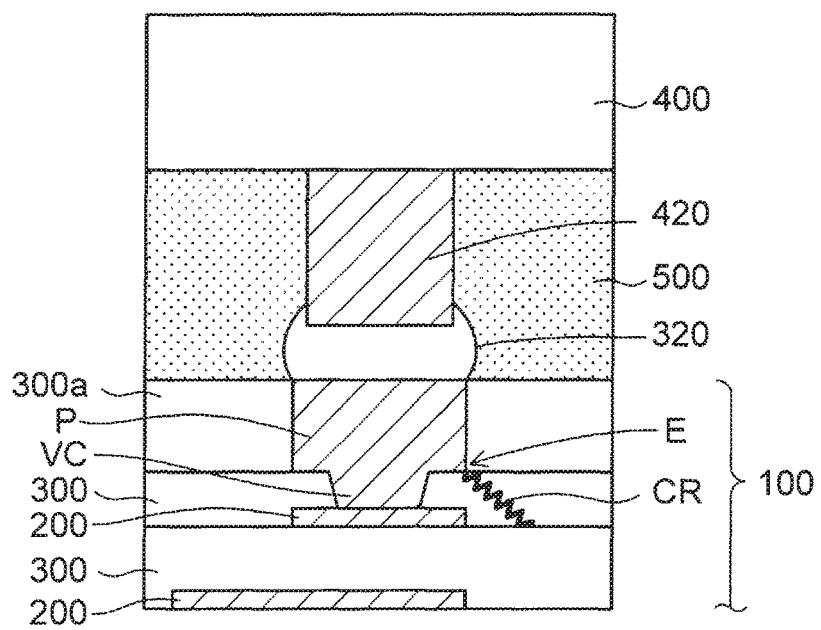
FIG. 2 is a cross-sectional view illustrating the state of a connection portion of a circuit board and a semiconductor chip in an electronic component device according to another preliminary technology.

FIGS. 1 and 2 are cross-sectional view illustrating the states of connection portions of circuit boards and semiconductor chips in electronic component devices according to the preliminary technologies.

As shown in FIG. 1, in an electronic component device according to a preliminary technology, a semiconductor chip 400 is connected to a circuit board 100 by flip-chip bonding.

The circuit board 100 has a structure configured by alternately stacking wiring layers 200 and resin layers 300, and on the uppermost resin layer 300, a connection pad P is formed of copper in an island pattern. The connection pad P is connected to the lower wiring layer 200 by a via conductor VC formed in the resin layer 300.

Also, the semiconductor chip 400 has a copper pillar 420 vertically formed on its element formation surface.

Further, the copper pillar 420 of the semiconductor chip 400 is connected to the connection pad P of the circuit board 100 by flip-chip bonding using solder 320.

Furthermore, the space between the circuit board 100 and the semiconductor chip 400 is filled with an underfill resin 500.

On the electronic component device having the above-described structure, temperature cycle test in a range between 125° C. and −55° C. is performed as a reliability test.

At this time, thermal stress is concentrated on lower corner portions E of the connection pad P of the circuit board 100. Therefore, cracks CR are generated from portions of a resin layer 300 contacting the lower corner portions E of the connection pad P into the resin layer.

If cracks CR are generated in the resin layer 300, even in wiring layers 200 disposed in the growth directions of the cracks, cracks are generated. Therefore, the reliability of electric connection is not achieved.

FIG. 2 shows a circuit board 100 having a structure in which the side surfaces of connection pad P of the circuit board 100 is covered by a resin layer 300a. The structure shown in FIG. 2 is the same as that of FIG. 1, except that the side surface of the connection pad P is covered by the resin layer 300a.

Even in a case of using the circuit board 100 having the structure as shown in FIG. 2, if a temperature cycle test is performed, similarly, thermal stress is concentrated on lower corner portions E of the connection pad P of the circuit board 100, whereby cracks CR are generated from portions of a resin layer 300 contacting lower corner portions E of the connection pad P into the resin layer.

A circuit board of an embodiment to be described below can solve the above-described problem.

(Embodiment)

Figure 12:
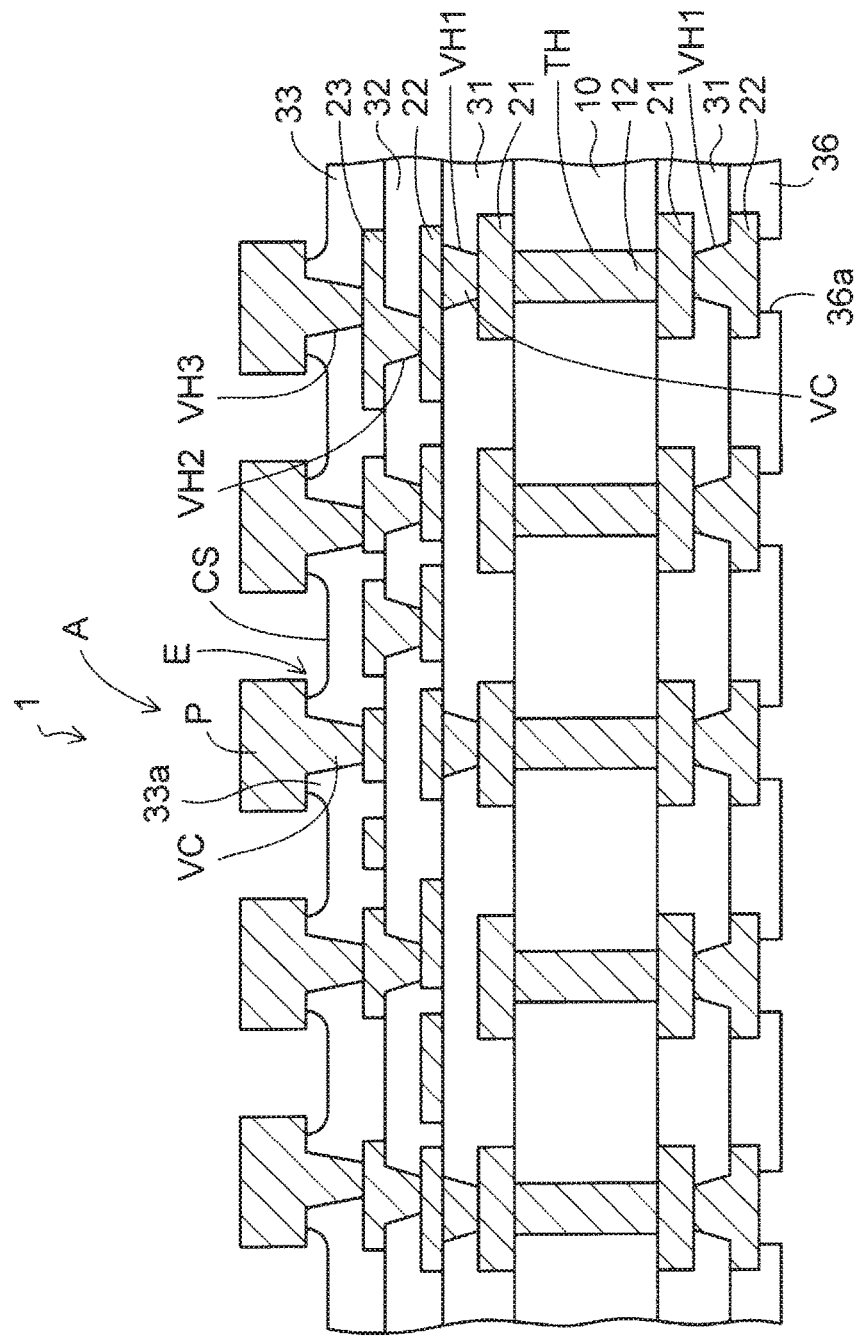
FIG. 12 is a cross-sectional view illustrating the circuit board of the embodiment.

FIGS. 3A to 11B are views for explaining a method of manufacturing a circuit board of an embodiment, and FIG. 12 is a view illustrating the circuit board according to the embodiment. Hereinafter, with a description of the method of manufacturing the circuit board, the structures of the circuit board and an electronic component device will be described.

Figure 3A:
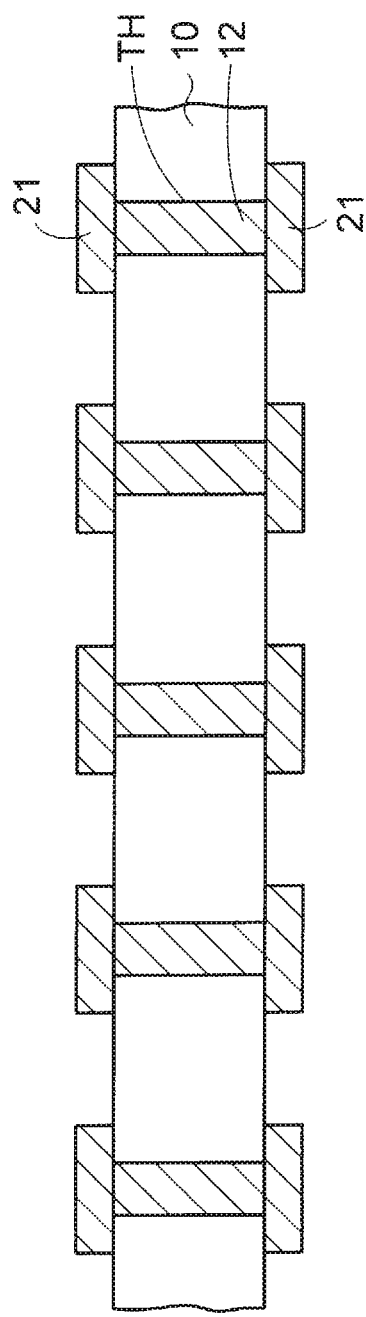
FIGS. 3A and 3B are cross-sectional views illustrating a first part of a method of manufacturing a circuit board of an embodiment.

In the method of manufacturing the circuit board of the embodiment, first, a core substrate 10 having a structure as shown in FIG. 3A is prepared. The core substrate 10 has through-holes TH formed in the thickness direction, and via conductors 12 formed inside the through-holes TH. The core substrate 10 is formed of an insulating material such as a glass-epoxy resin.

Also, the core substrate 10 has first wiring layers 21 formed on both surfaces, respectively. The first wiring layers 21 formed on both surfaces are connected to each other by the via conductors 12.

Alternatively, it is possible to form through-hole plating layers on the side walls of the through-holes TH of the core substrate 10 and then fill a resin inside the through-holes TH. In this case, the first wiring layers 21 formed on both surfaces are connected to each other by the through-hole plating layers.

The through-holes TH of the core substrate 10 are formed by a drill, a laser, or the like. Also, the via conductors 12 and the first wiring layers 21 of the core substrate 10 are formed by a plating method, photolithography, and so on.

Figure 3B:
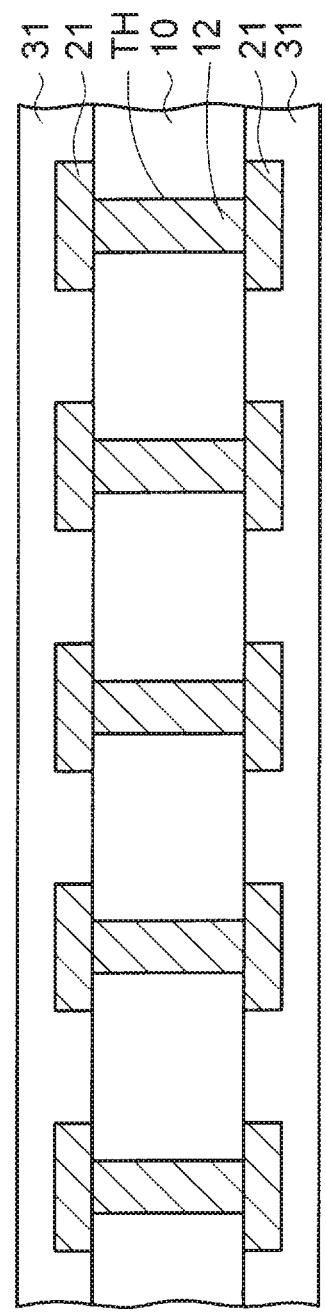

Subsequently, as shown in FIG. 3B, uncured resin films are stuck on both surface sides of the core substrate 10, and are cured by a heating process, whereby first insulating layers 31 are formed respectively.

Figure 4A:
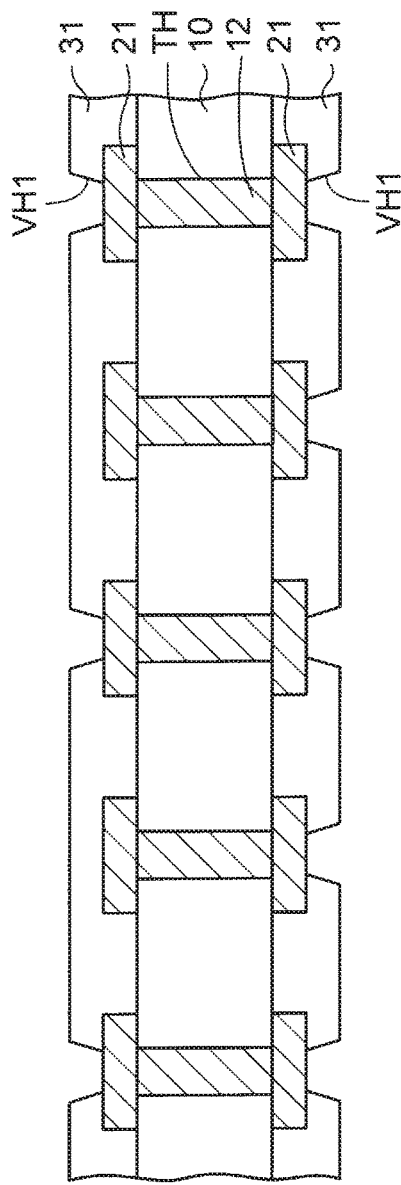
FIGS. 4A and 4B are cross-sectional views illustrating a second part of the method of manufacturing the circuit board of the embodiment.

Further, the first insulating layers 31 formed on both surface sides are processed with a laser, whereby first via holes VH1 are formed so as to reach connection portions of the first wiring layers 21 of both surface sides, as shown in FIG. 4A, In order to form the first via holes VH1 with a laser, the first insulating layers 31 may be formed of a non-photosensitive resin. As the resin material, epoxy resin, polyimide resin, and the like can be used. The thickness of the first insulating layers 31 is between 20 μm and 40 μm, for example, 30 μm.

Further, resin smears are removed from the insides of the first via holes VH1 by performing a desmear process using a permanganate method or the like such that the insides of the first via holes become clean.

Figure 4B:
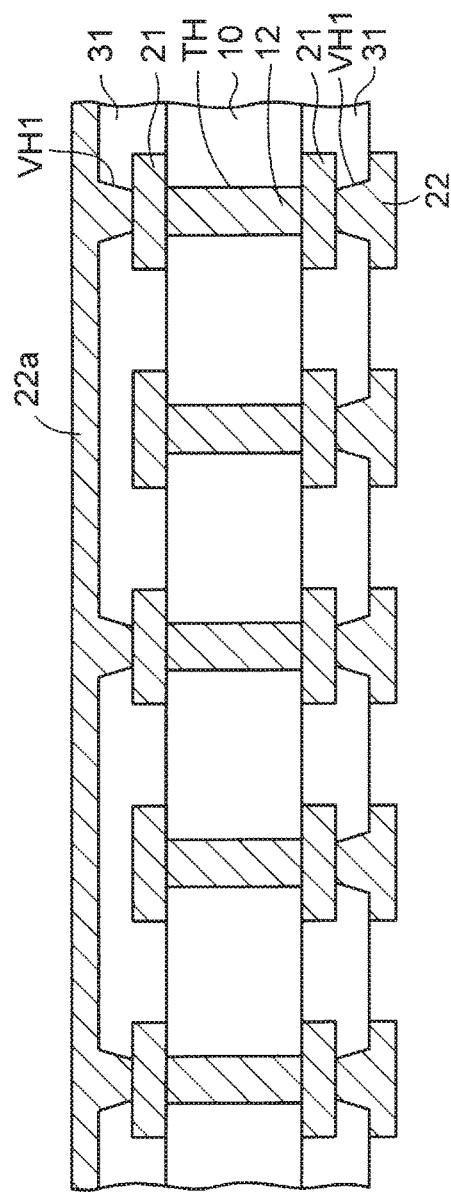

Subsequently, on the first insulating layer 31 formed on the upper surface side of the core substrate 10, a metal layer 22a is formed as shown in FIG. 4B. The metal layer 22a is connected to the first wiring layers 21 by via conductors formed in the first via holes VH1. Also, the metal layer 22a is formed in a blanket shape.

More specifically, first, on the first insulating layer 31 and the inner surfaces of the first via holes VH1, a seed layer is formed of copper by electroless plating or sputtering. Thereafter, a copper plating layer or the like is formed by electrolytic plating using the seed layer as a power supply path for plating, whereby the metal layer 22a is obtained.

Further, at the same time as the formation of the metal layer, a second wiring layer 22 is formed on the first insulating layer 31 formed on the lower surface side of the core substrate 10, so as to be connected to the first wiring layers 21 by via conductors formed inside the first via holes VH1. The second wiring layer 22 is formed, for example, by a semi-additive method.

Subsequently, the metal layer 22a is polished by chemical mechanical polishing (CMP) until the upper surface of the first insulating layer 31 is exposed, and then the upper surface of the first insulating layer 31 is polished so as to become flat, as shown in FIG. 5A.

As a result, the global unevenness of the first insulating layer 31 caused by the unevenness of the first wiring layer 21 is solved, whereby the upper surface of the first insulating layer 31 becomes a flat surface.

Also, the via conductors VC remain as via electrodes inside the first via holes VH1 of the first insulating layer 31. Further, the upper surfaces of the via conductors VC and the upper surface of the first insulating layer 31 become flush with each other.

As described above, the metal layer 22a which is formed on the upper surface side of the core substrate 10 is formed for flattening the base, and is removed by polishing.

Subsequently, on the first insulating layer 31 formed on the upper surface side of the core substrate 10, a second wiring layer 22 is formed so as to be connected to the via conductors VC, as shown in FIG. 5B. The second wiring layer 22 is formed by a semi-additive method.

Specifically, first, on the first insulating layer 31 and the via conductors VC, a seed layer (not shown in the drawings) is formed of copper or the like by sputtering. Subsequently, a plating resist layer (not shown in the drawings) is formed so as to have openings at positions for disposing the second wiring layer 22.

Next, a metal plating layer (not shown in the drawings) is formed of copper or the like inside the openings of the plating resist layer by electrolytic plating using the seed layer as a power supply path for plating.

Thereafter, the plating resist layer is removed, and then the seed layer is removed using the metal plating layer as a mask, whereby the second wiring layer 22 is obtained. The thickness of the second wiring layer 22 is set to be smaller than the thickness of the first wiring layer 21, for example, 5 µm to 10 µm. Also, the second wiring layer 22 is formed in a pattern finer than that of the first wiring layer 21.

Since the upper surface of the first insulating layer 31 is flattened, even if the focal depth of photolithography decreases when the fine pattern is formed by a semi-additive method, it is possible to accurately form a plating resist layer in the fine pattern on the substrate.

In this way, it is possible to form the fine second wiring layer 22 according to designed specifications with a high yield such that the ratio of the width of lines and the width of spaces (between lines) becomes, for example, 2 (µm): 2 (µm). This is applied even to formation of a third wiring layer and connection pads.

Figure 6:
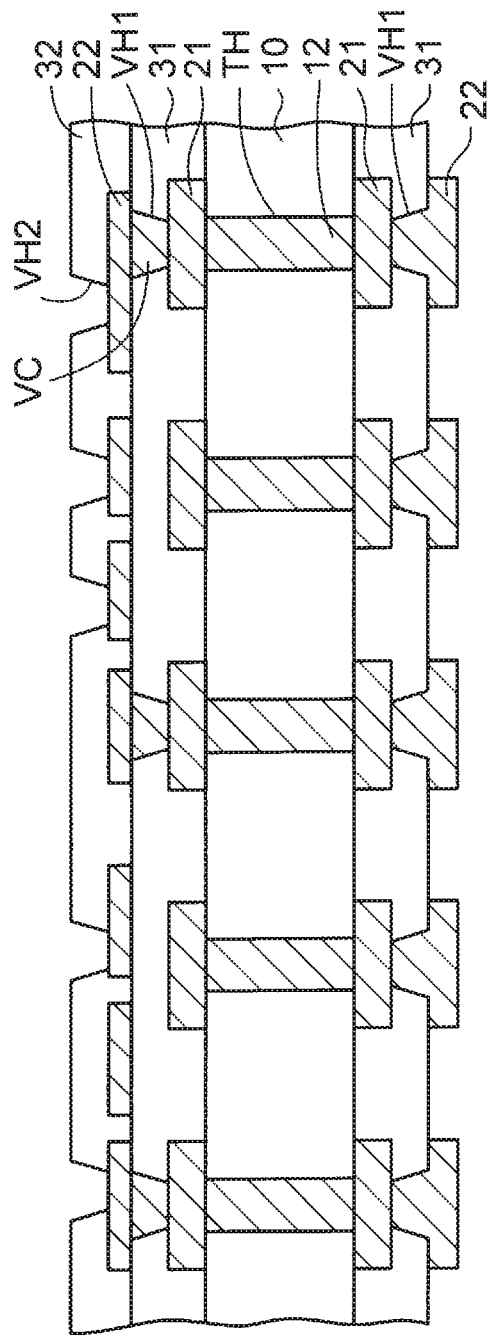
FIG. 6 is a cross-sectional view illustrating a fourth part of the method of manufacturing the circuit board of the embodiment.

Subsequently, as shown in FIG. 6, on the first insulating layer 31 and the second wiring layer 22, a photosensitive resin layer (not shown in the drawings) is formed, and is exposed and developed on the basis of photolithography, and then is cured by a heating process. The formation of the photosensitive resin layer may be an application of a liquid resin or sticking of a thin resin film.

In the above-described way, on the first insulating layer 31, a second insulating layer 32 is formed so as to have second via holes VH2 on connection portions of the second wiring layer 22.

The photosensitive resin layer is patterned by photolithography, whereby it is possible to form the thin second insulating layer 32 so as to have the fine second via holes VH2. The thickness of the second insulating layer 32 is set to be smaller than the thickness of the first insulating layer 31, for example, about 5 µm to 10 µm.

As a preferred example of the second insulating layer 32, an insulating resin layer which is formed of a phenolic resin or a polyimide resin having photosensitivity can be used. The same insulating resin material and the same forming method can also be used to form the following other insulating layers.

Since the second insulating layer 32 is formed of a photosensitive resin, it does not contain any filler such as silica. The reason is that, when the photosensitive resin is exposed and developed to form the via holes, fillers remain in the via holes.

Figure 7:
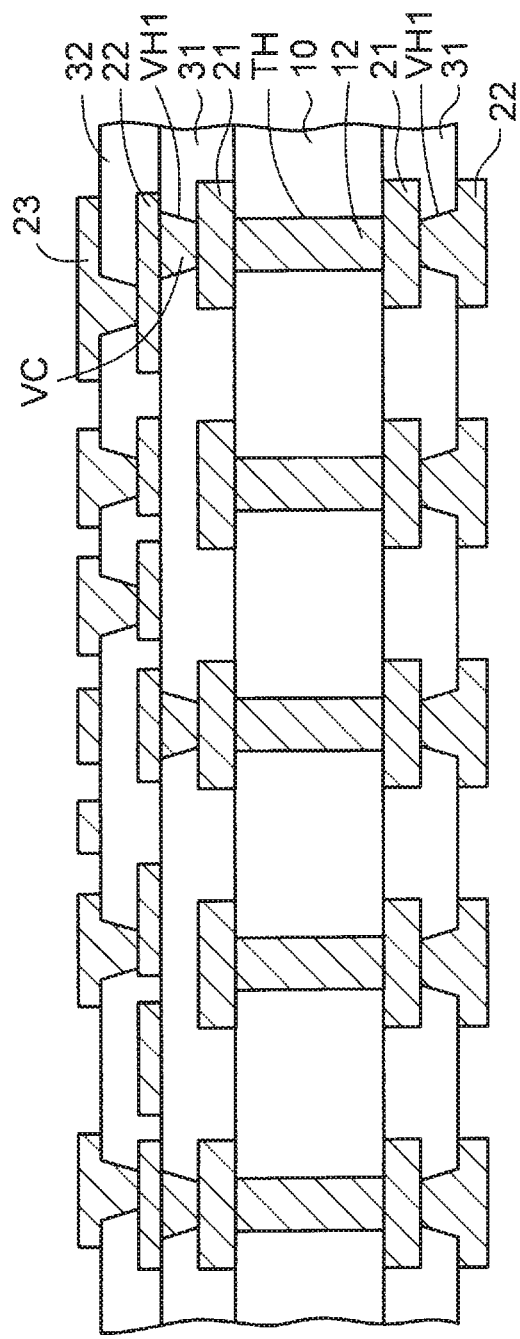
FIG. 7 is a cross-sectional view illustrating a fifth part of the method of manufacturing the circuit board of the embodiment.

Subsequently, on the second insulating layer 32, a third wiring layer 23 is formed as shown in FIG. 7. The third wiring layer 23 is connected to the second wiring layer 22 formed on the upper surface side of the core substrate 10, by via conductors formed inside the second via holes VH2. The third wiring layer 23 is formed by a semi-additive method.

Figure 8:
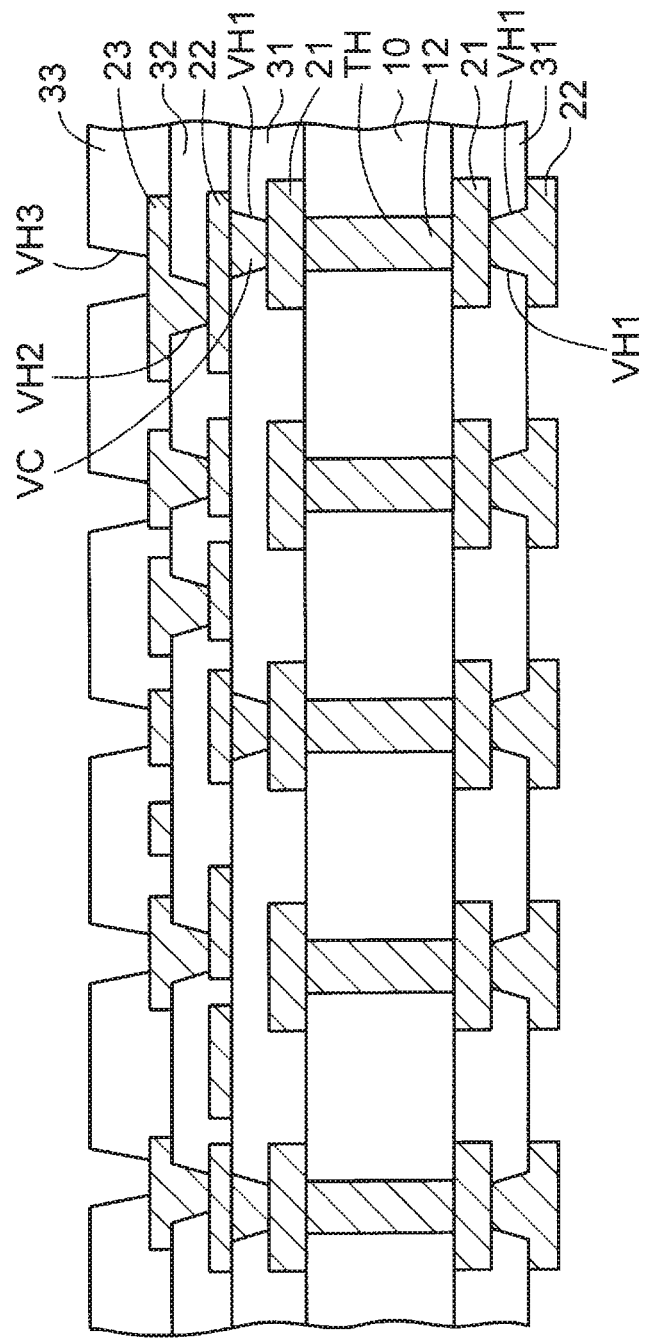
FIG. 8 is a cross-sectional view illustrating a sixth part of the method of manufacturing the circuit board of the embodiment.

Subsequently, on the second insulating layer 32, a third insulating layer 33 is formed as shown in :FIG. 8. The third insulating layer 33 is formed by the same method as the method of forming the second insulating layer 32 of FIG. 6 described above, and has third via holes VH3 disposed on connection portions of the third wiring layer 23. Similarly to the second insulating layer 32, the third insulating layer 33 is formed of a photosensitive resin, and does not contain any tillers such as silica.

The third via holes VH3 are formed in such a shape that the diameter of the opening side is larger than the diameter of the bottom side for exposing the third wiring layer 23. Like this, the third via holes VH3 are formed in a tapered shape.

Subsequently, on the third insulating layer 33, connection pads P are formed as shown in FIG. 9. The connection pads P are connected to the third wiring layer 23 formed on the upper surface side of the core substrate 10 by via conductors VC formed inside the third via holes VH3.

The via conductors VC which are formed inside the third via holes VH3 are formed in such an inverted truncated cone shape that the diameter of the end side contacting the connection pads P is larger than the diameter of the end side contacting the third wiring layer 23.

As shown in a partially reduced plan view of FIG. 9, the connection pads P are formed in a plurality of island patterns disposed at intervals. The connection pads P may be disposed in a grid-like pattern in an area array form over the entire surface of the substrate, or may be disposed in a parallel form on the peripheral portion of the substrate.

For example, the thickness of the connection pads is about 10 µm from the upper surface of the third insulating layer 33, and the diameter of the connection pads P is 25 to 30 µm.

The connection pads P are formed by a semi-additive method. Specifically, on the third insulating layer 33 and the inner surfaces of the third via holes VH3 of FIG. 8, a titanium (Ti) layer 24a and a copper (Cu) layer 24b are sequentially formed as shown in a partially enlarged cross-sectional view of FIG. 10A, by sputtering. The titanium layer 24a and the copper layer 24b form a seed layer 24.

For example, the thickness of the titanium layer 24a is 0.02 µm, and the thickness of the copper layer 24b is 0.5 µm. Since the copper layer which is formed by sputtering has poor adhesiveness with respect to the insulating layer (the resin), the titanium layer 24a is formed to function as an adhesion layer between the third insulating layer 33 and the copper layer 24b.

Subsequently, on the seed layer 24, a plating resist layer 35 is formed so as to have openings 35a in areas for disposing the connection pads P as shown in FIG. 10B.

Thereafter, a metal such as copper is filled in the third via holes VH3 and the openings 35a of the plating resist layer 35 by electrolytic plating using the seed layer 24 as a power supply path, whereby a metal plating layer 26 is formed as shown in FIG. 11A.

Subsequently, the plating resist layer 35 is removed as shown in FIG. 11B. Thereafter, the seed layer 24 is removed by etching using the metal plating layer 26 as a mask. The copper layer 24b of the seed layer 24 is removed by wet etching.

Also, the titanium layer 24a of the seed layer 24 is removed by dry etching using a fluorine-based etching gas such as carbon tetrafluoride ($CF_4$). As dry etching on the titanium layer 24a, anisotropic dry etching may be used, or isotropic dry etching may he used.

In the above-described way, the connection pads P are formed by he seed layer 24 composed of the titanium layer 24a and the copper layer 24b, and the metal plating layer 26 disposed on the seed layer 24. The connection pads P and the via conductors VC are integrally formed by the metal plating layer 26.

Subsequently, by isotropic dry etching using oxygen ($O_2$) gas and using the connection pads P as a mask, the horizontally exposed third insulating layer 33 is etched to a depth of half of the thickness, as shown in FIG. 12.

For example, in a case where the thickness of the third insulating layer 33 is 10 μm, the amount of etching in the thickness direction and the horizontal direction of the third insulating layer 33 is 2 μm to 5 μm. In a case where the thickness of the third insulating layer 33 is 5 μm, the amount of etching in the thickness direction and the horizontal direction of the third insulating layer 33 is 2 μm to 3 μm.

In the above-described way, some portions of the third insulating layer 33 are removed by etching, whereby protrusions 33a are formed. The protrusions 33a are formed integrally with the third insulating layer 33. Also, the upper surfaces of the protrusions 33a are formed as flat surfaces.

Further, the protrusions 33a are formed in such a truncated corn shape that the diameter of the base side is larger than the diameter of the upper surface. Also, the side surfaces of the protrusions 33a are formed in a concave surface shape.

The connection pads P are formed in a size larger than the size of the upper surfaces of the protrusions 33a. Specifically, the diameter of the connection pads P is set to he larger than the diameter of the upper surfaces of the protrusions 33a. Also, the peripheral portions of the lower surfaces of the connection pads P and the surface of the third insulating layer 33 are apart from each other.

In the above-described way, the third insulating layer 33 is formed so as not to contact the lower corner portions E of the connection pads P. Since points of the third insulating layer 33 which may become the origins of cracks are removed, it is possible to prevent the third insulating layer 33 from being cracked, as will be described below.

As the etching gas for the isotropic dry etching, besides oxygen gas, a fluorine-based gas such as carbon tetrafluoride ($CF_4$), or a mixture of oxygen gas and a fluorine-based gas may be used.

As an isotropic dry etching machine, a machine capable of fixing the lower surface side of the core substrate 10 on a chuck such that the first insulating layer 31 formed on the lower surface side of the core substrate 10 is not etched and radiating plasma only onto the upper surface side of the core substrate 10 is used.

Subsequently, on the first insulating layer 31 formed on the lower surface side of the core substrate 10, similarly, a solder resist layer 36 is formed so as to have openings 36a on the connection portions of the second wiring layer 22, as shown in FIG. 11

Thereafter, the surfaces of the connection pads P are processed with an acid-based solution, whereby oxide films formed on the surfaces of the connection pads P are removed. Then, in order to prevent oxidation of the surfaces of the connection pads P, an organic solderability preservative (OSP) process is performed.

By the OSP process, an organic coating of an azole compound, an imidazole compound, or the like is formed on the connection pads P.

Alternatively, on the surfaces of the connection pads P, a nickel (Ni) layer and a gold (Au) layer may be sequentially formed by plating, instead of the ( )P process.

The same process is also performed on the connection portions of the second wiring layer 22 formed on the lower surface side of the core substrate 10.

As a result, a circuit board 1 of the embodiment is obtained.

As shown in FIG. 12, the circuit board 1 of the embodiment has the core substrate 10 having the structure described above with reference to FIG. 3A, inside the circuit board in the thickness direction. The core substrate 10 has the first wiring layers 21 formed on both surfaces and connected to each other by the via conductors 12.

The core substrate 10 has the first insulating layers 31 formed on both surface sides, respectively, and having the first via holes VH1 disposed on the connection positions of the first wiring layers 21. The first via holes VH1 of the upper surface side of the core substrate 10 have the via conductors VC buried therein, and the upper surfaces of the via conductors VC and the upper surface of the first insulating layer 31 are flush with each other, that is, they are flat.

On the first insulating layer 31 of the upper surface side of the core substrate 10, the second wiring layer 22 is formed so as to be connected to the first wiring layers 21 by the via conductors VC formed inside the first via holes VH1.

Also, on the first insulating layer 31 of the lower surface side of the core substrate 10, the second wiring layer 22 is formed so as to be connected to the first wiring layers 2.1 by the via conductors formed inside the first via holes VH1. Further, on the first insulating layer 31 of the lower surface side of the first insulating layer 31, the solder resist layer 36 is formed so as to have the openings 36a on the connection portions of the second wiring layer 22.

Also, on the first insulating layer 31 of the upper surface side of the core substrate 10, the second insulating layer 32 is formed so as to have the second via holes VH2 on the connection portions of the second wiring layer 22. On the second insulating layer 32 of the upper surface side of the core substrate 10, the third wiring layer 23 is formed so as to be connected to the second wiring layer 22 by the via conductors formed inside the second via holes VH2.

Also, on the second insulating layer 32 of the upper surface side of the core substrate 10, the third insulating layer 33 is formed so as to have the third via holes VH3 on the connection portions of the third wiring layer 23. On the third insulating layer 33 of the upper surface side of the core substrate 10, the connection pads P are formed so as to be connected to the third wiring layer 23 by the via conductors VC formed inside the third via holes VH3.

As described above, below the connection pads P, the via conductors VC are formed through the third insulating layer 33, and the connection pads P are connected to the third wiring layer 23 disposed below the third insulating layer 33 by the via conductors VC.

Figure 13A:
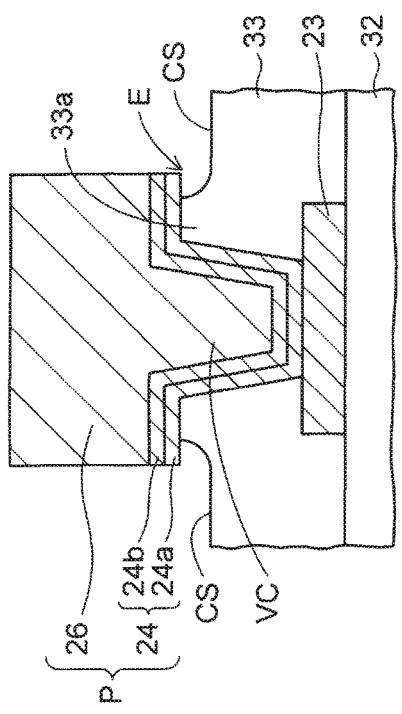
FIGS. 13A and 13B are a partially enlarged cross-sectional view and a partially enlarged plan view illustrating the state of an area including a connection pad of the circuit board of FIG. 12, respectively.
Figure 13B:
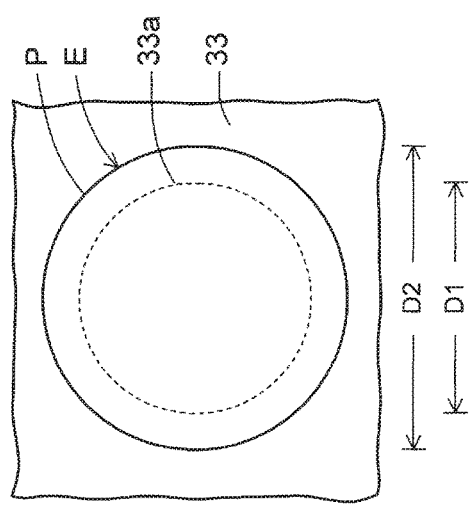

FIG. 13A is a partially enlarged cross-sectional view illustrating an area shown by a reference symbol "A" in FIG. 12, and FIG. 13B is a partially enlarged plan view illustrating a connection pad of FIG. 13A as seen from the above.

Referring to FIG. 13A together with FIG. 12, as described above, the third insulating layer 33 is etched to a depth of half of the thickness by isotropic dry etching using the connection pads P as a mask. Therefore, the third insulating layer 33 is etched in the thickness direction and the horizontal direction from the lower corner portions E of the connection pads P by the same thickness.

As a result, the etched portions of the upper surface of the third insulating layer 33 become concave surfaces CS having a predetermined depth toward the inner sides of the lower surfaces of the connection pads P from the lower corner portions E. Also, the unetched portions of the upper surface of the third insulating layer 33 become the protrusions 33a protruding upward in the thickness direction.

The third insulating layer 33 has the concave surfaces CS formed from the outer portions of the lower surfaces of the connection pads P toward the surrounding areas, and the protrusions 33a surrounded by the concave surfaces CS.

As described above, the third insulating layer 33 has the protrusions 33a formed on the surface. Further, on the upper surfaces of the protrusions 33a of the third insulating layer 33, the connection pads are formed. The peripheral portions of the lower surfaces of the connection pads P are exposed from the protrusions 33a.

Also, the peripheral portions of the lower surfaces of the connection pads P and the surface of the third insulating layer 33 are apart from each other.

As shown in FIG, 13B, the outside diameter D2 of the connection pads P is larger than the outside diameter D1 of the protrusions 33a of the third insulating layer 33.

As described above, the upper surfaces of the protrusions 33a of the third insulating layer 33 contact the inner portions of the lower surfaces of the connection pads P except for the peripheral portions of the lower surfaces, and the concave surfaces CS of the third insulating layer 33 do not contact the lower corner portions E of the connection pads P.

The lower corner portions E and the peripheral portions of the lower surfaces of the connection pads P are exposed from the third insulating layer 33. As shown in FIGS. 13A and 13B, the lower corner portions E of the connection pads P are annular portions where the side surfaces of the connection pads P intersect with the lower surfaces of the connection pads P.

If this structure is used, the third insulating layer 33 does not exist at the lower corner portions E of the connection pads P on which thermal stress may be concentrated, the third insulating layer 33 does not have any portion to be the origin of a crack. Therefore, it is possible to prevent cracking and peeling from occurring in the third insulating layer 33 disposed below the connection pads P.

Also, since the third insulating layer 33 is etched such that the upper surfaces of the protrusions 33a of the third insulating layer 33 contact the inner portions of the lower surfaces of the connection pads P, the protrusions 33a of the third insulating layer 33 function as bases supporting the connection pads P. Therefore, in a case of connecting a semiconductor chip to the connection pads P of the circuit board 1 by flip-chip bonding, it is possible to secure sufficient strength.

Unlike the present embodiment, in a structure in which the third insulating layer 33 is etched until all of the lower surfaces of the connection pads P are exposed from the third insulating layer 33. the connection pads P are supported only by the via conductors VC formed inside the third via holes VH3.

For this reason, in a case of connecting semiconductor chips to the connection pads P of the circuit board 1 by flip-chip bonding, since the load is concentrated on the via conductors disposed immediately below the connection pads P, cracks may be generated. Therefore, it is not preferable.

Also, the connection pads may be disposed so as to be connected to one-side ends or insides of lead-out wirings. In this mode, the insulating layer is etched by isotropic dry etching using the lead-out wirings and the connection pads as a mask, whereby the same concave surfaces CS and the protrusions 33a are formed corresponding to all of the lead-out wirings and the connection pads.

However, in a case where the connection pads P are disposed in isolation in an island pattern, thermal stress tends to be concentrated on the lower corner portions E and be likely to cause the third insulating layer 33 to be cracked. Therefore, the effect of the structure of the present embodiment is more beneficial.

Now, a method of manufacturing an electronic component device using the circuit board 1 of FIG. 12 will be described.

Figure 14:
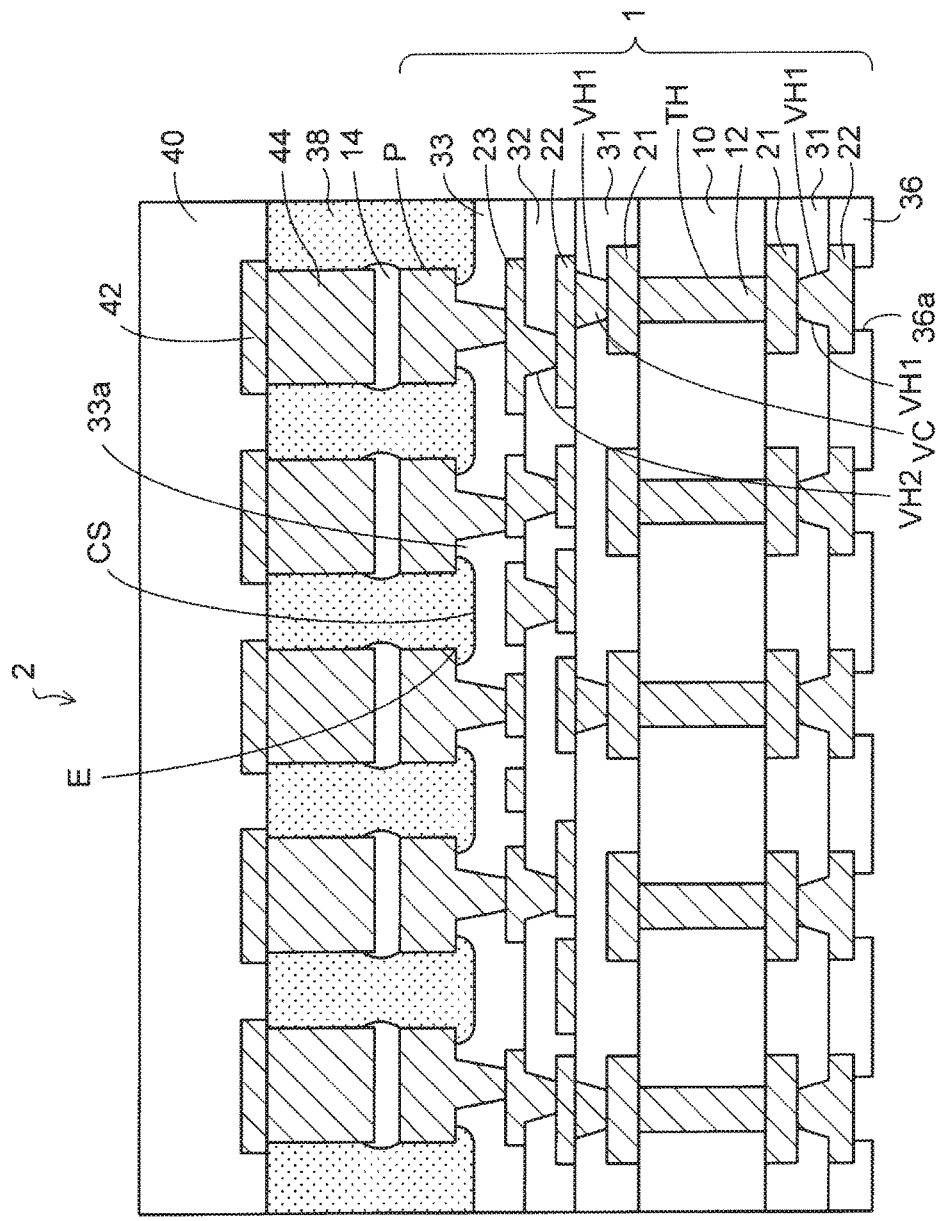
FIG. 14 is a cross-sectional view illustrating an electronic component device of the embodiment.

As shown in FIG. 14, a semiconductor chip 40 is prepared. The semiconductor chip 40 has electrode pads 42 disposed on its element formation surface, and copper pillars 44 connected to the electrode pads 42. For example, the height of the copper pillars 44 is 20 μm to 30 μm, and the diameter of the copper pillar 44 is about 25 μm.

The semiconductor chip 40 is an example of an electronic component, and the copper pillars 44 are examples of bump electrodes, and it is possible to use various electronic components having bump electrodes.

Subsequently, the copper pillars 44 of the semiconductor chip 40 are disposed on the connection pads P of the circuit board 1 of FIG. 12 with solder 14 interposed therebetween, and then reflow heating is performed. In this way, the copper pillars 44 of the semiconductor chip 40 are connected to the connection pads P of the circuit board 1 by flip-chip bonding.

As the solder 14, for example, tin (Sn) silver (Ag) based solder can be used, and reflow temperature is set to about 240° C.

The solder 14 may be applied on the leading ends of the copper pillars 44 of the semiconductor chip 40, or may be applied on the leading ends of the connection pads P of the circuit board 1.

Subsequently, similarly, as shown in FIG. 14, the space between the circuit board 1 and the semiconductor chip 40 is filled with an underfill resin 38. In a case of using a large board for manufacturing multiple products as a circuit board, after semiconductor chips are mounted on a plurality of mounting areas of the circuit board, the circuit board is cut.

As a result, an electronic component device 2 of the embodiment is obtained.

As shown in FIG. 14, in the electronic component device 2 of the embodiment, the copper pillars 44 of the semiconductor chip 40 are connected to the connection pads P of the circuit board 1 of FIG. 12 by flip-chip bonding using the solder 14. Further, the space between the circuit board 1 and the semiconductor chip 40 is filled with the underfill resin 38.

Figure 15:
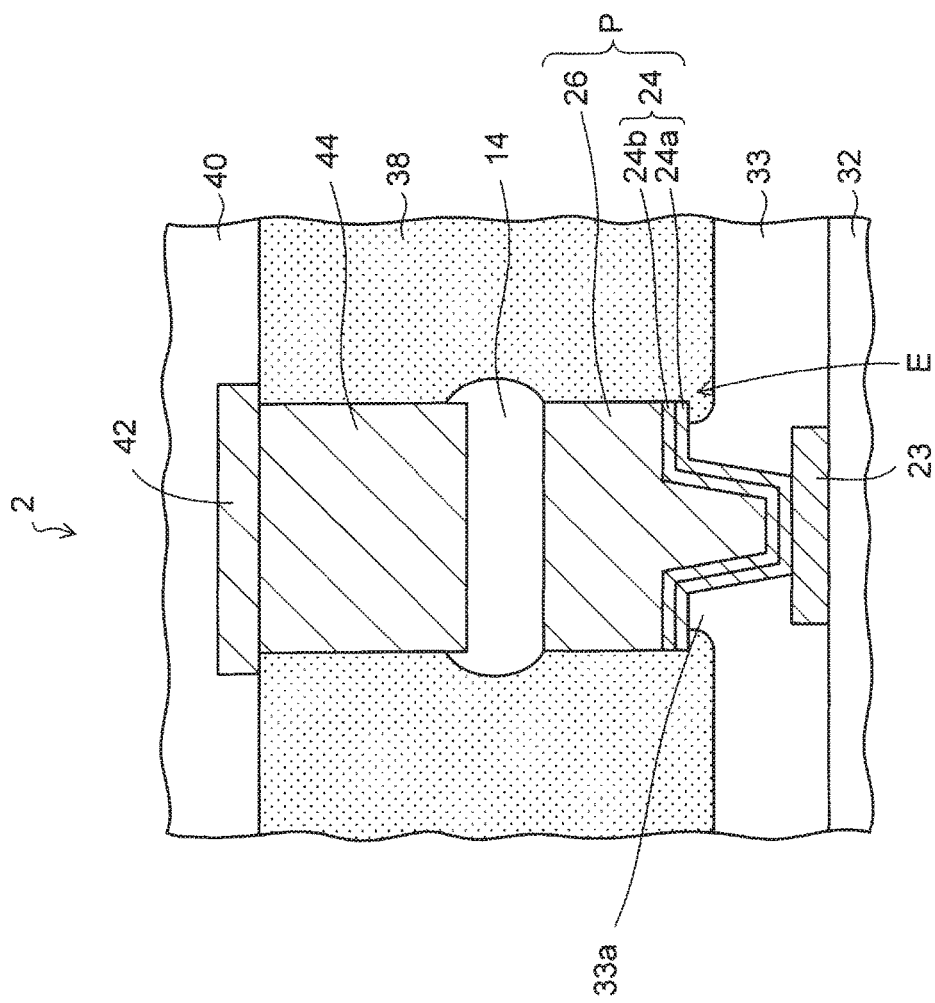
FIG. 15 is a partially enlarged cross-sectional view illustrating the state of a connection portion of the circuit board and a semiconductor chip in the electronic component device of FIG. 14.

On the electronic component device 2 of the embodiment, a temperature cycle test in a range between 125° C. and −55° C. is performed as a reliability test. FIG. 15 is a partially enlarged cross-sectional view illustrating a connection portion of the circuit board 1 and the semiconductor chip 40 shown in FIG. 14.

As shown in FIG. 15, if a temperature cycle test is performed on the electronic component device 2, thermal stress caused on the basis of the differences between the thermal expansion coefficients of individual elements is concentrated on the lower corner portions E of the connection pads P. However, since the third insulating layer 33 does not contact the lower corner portions E of the connection pads P, cracking and peeling are prevented from occurring in the third insulating layer 33.

Also, as described above, the protrusions 33a of the third insulating layer 33 of the circuit board 1 function as bases supporting the connection pads P. Therefore, in the case of connecting the semiconductor chip 40 to the circuit board by flip-chip bonding, it is possible to secure sufficient strength.

As shown in FIG. 15, in the electronic component device 2, the third insulating layer 33 does not contact the lower corner portions E of the connection pads P, but the underfill resin 38 contacts the lower corner portions E of the connection pads P.

At the lower corner portions E of the connection pads P, only two different materials of the connection pads P and the underfill resin 38 contact each other. In contrast with this, at the lower corner portions E of the connection pads of the structure of FIG. 1 described with respect to a preliminary technology, three materials of the connection pads P, an insulating layer 300, and the underfill resin 500 contact one another.

Therefore, thermal stress which is concentrated on the lower corner portions F of the connection pads P of the circuit board 1 of the present embodiment is less than that in the structure of the preliminary technology shown in FIG. 1.

Further, since the underfill resin 38 contains 30 wt % to 70 wt % of fillers such as silica, for example, 50 wt % of fillers, the underfill resin is a resin material unlikely to be cracked. As the resin material of the underfill resin 38, for example, epoxy resin can be used.

In contrast with this, the third insulating layer 33 of the circuit board 1 is formed of the photosensitive resin in order to obtain fine via holes, and thus does not contain any filler. Therefore, the third insulating layer 33 is more likely to be cracked than the underfill resin 38 is.

If the structure in which the third insulating layer 33 does not contact the lower corner portions E of the connection pads P is used from the above-described viewpoint, it is possible to efficiently prevent the third insulating layer 33 from being cracked. Therefore, it is possible to avoid cracking of the wiring layers, and thus it is possible to improve electrical reliability of the electronic component device 2.

Figure 16:
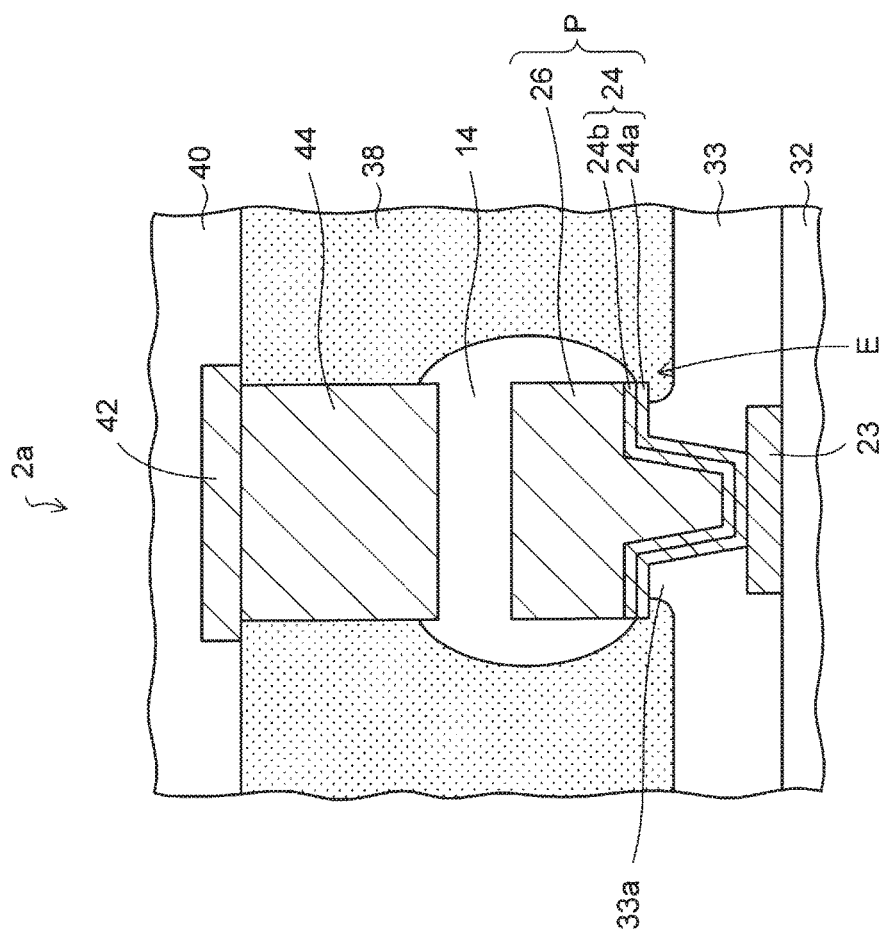
FIG. 16 is a cross-sectional view illustrating the state of a connection portion of a circuit board and a semiconductor chip in an electronic component device of a modification of the embodiment.

FIG. 16 shows the state of a connection portion of an electronic component device 2a of a modification of the embodiment. In FIG. 15 described above, the solder 14 is disposed on the leading end portions of the connection pads P of the circuit board 1 and the leading end portions of the copper pillars 44 of the semiconductor chip 40.

FIG. 16 shows a mode in which the connection pads and the copper pillars are connected by solder 14 with a large volume. As shown in :FIG. 16, in this mode, the solder 14 flows from the spaces between the connection pads P of the circuit board 1 and the copper pillars 44 of the semiconductor chip 40 toward the side surfaces of the connection pads P.

In this time, at the lowest portions of the side surfaces of the connection pads P, there is the titanium layer 24a unlikely to be wet by solder. For this reason, the solder 14 flowing on the side surfaces of the connection pads P flows on the side surfaces of the copper layer 24b of the seed layer 24, but the solder 14 is repelled from the side surfaces of the titanium layer 24a, whereby the flow is stopped.

As described above, even in the case of increasing the volume of the solder 14, in the areas between the connection pads P, the solder 14 does not flow. Therefore, even if the arrangement pitch of the connection pads P of the circuit board 1 is reduced, it is possible to prevent occurrence of electric short circuits between the connection pads P, without reducing the volume of the solder 14.

Also, in a case of forming the protrusions 33a as shown in FIG. 12 by etching the third insulating layer 33 by isotropic dry etching using a fluorine-based gas, some conditions cause the titanium layer 24a of the seed layer 24 to be etched.

For this reason, in a case of using the connection portions of the electronic component device 2a of the modification, it is necessary to etch the third insulating layer 33 as shown in FIG. 12 described above by isotropic dry etching using only oxygen gas.

Although FIG. 16 is different from FIG. 15 in that the volume of the solder 14 is large, it is the same as FIG. 15 in the other elements, and thus a description of them will not be made.

This disclosure further encompasses various exemplary embodiments, for example, described below.

1. A method of manufacturing a circuit board, comprising:
  forming a connection pad on an insulating layer; and
  etching the insulating layer, using the connection pad as a mask, such that a protrusion of the insulating layer is formed below a lower surface of the connection pad and a peripheral portion of the lower surface of the connection pad is exposed from the protrusion.

2. The method of manufacturing a circuit board according to claim 1, further comprising:
  before forming the connection pad, forming the insulating layer on a wiring layer so as to have a via hole reaching the wiring layer,
  wherein, when the connection pad is formed, the connection pad is connected to the wiring layer by a via conductor formed inside the via hole.

3. The method of manufacturing a circuit board according to claim 1 or 2, wherein:
  a size of the connection pad is larger than a size of the upper surface of the protrusion.

4. The method of manufacturing a circuit board according to any one of claims 1 to 3, wherein:
  when the insulating layer is etched, the peripheral portion of the lower surface of the connection pad is apart from a surface of the insulating layer.

5. The method of manufacturing a circuit board according to any one of claims 1 to 4, wherein:
  the insulating layer is formed of a photosensitive resin.

6. The method of manufacturing a circuit board according to any one of claims 1 to 5, wherein:
  the insulating layer is formed of a resin, and
  the insulating layer is etched by isotropic dry etching, and the isotropic dry etching uses oxygen gas, or a fluorine-based gas, or a mixture of oxygen gas and a fluorine-based gas.

What is claimed is:
1. A circuit board comprising:
  an insulating layer having a plurality of protrusions on a surface; and
  a plurality of connection pads, each of the plurality of connection pads being formed on an upper surface of only a respective one of the plurality of protrusions,
  wherein a peripheral portion of a lower surface of each of the plurality of connection pads is exposed from the respective one of the plurality of protrusions, and upper and side surfaces of each of the plurality of connection pads are exposed from the insulating layer.

2. The circuit board according to claim 1, wherein:
a size of each of the plurality of connection pads is larger than a size of the upper surface of the respective one of the plurality of protrusions.

3. The circuit board according to claim 1, wherein:
the peripheral portion of the lower surface of each of the plurality of connection pads is separated from the surface of the insulating layer.

4. The circuit board according to claim 1, further comprising:
a plurality of via conductors each passing through one of the plurality of protrusions; and
a wiring layer disposed below the insulating layer,
wherein each of the plurality of connection pads is connected to the wiring layer by a respective one of the plurality of via conductors.

5. The circuit board according to claim 1, wherein:
the insulating layer is formed of a photosensitive resin.

6. The circuit board according to claim 1, wherein:
each of the plurality of connection pads includes a seed layer located at the lower surface side and a metal layer disposed on the seed layer, and
a peripheral portion of a lower surface of the seed layer is exposed from the respective one of the plurality of protrusions.

7. The circuit board according to claim 1, wherein an entirety of upper and side surfaces of each of the plurality of connection pads is exposed from the insulating layer.

8. An electronic component device comprising:
a circuit board which includes an insulating layer having a plurality of protrusions on a surface, and a plurality of connection pads, each of the plurality of connection pads being formed on an upper surface of only a respective one of the plurality of protrusions, and in which a peripheral portion of a lower surface of each of the plurality of connection pads is exposed from the respective one of the plurality of protrusions, and upper and side surfaces of each of the plurality of connection pads are exposed from the insulating layer;
an electronic component connected to the plurality of connection pads of the circuit board by flip-chip bonding; and
an underfill resin filled between the circuit board and the electronic component.

9. The electronic component device according to claim 8, wherein an entirety of upper and side surfaces of each of the plurality of connection pads is exposed from the insulating layer.

* * * * *